United States Patent
Nishikawa et al.

(10) Patent No.: US 12,352,821 B2
(45) Date of Patent: Jul. 8, 2025

(54) CALCULATION SYSTEM, BATTERY CHARACTERISTIC ESTIMATION METHOD, AND BATTERY CHARACTERISTIC ESTIMATION PROGRAM

(71) Applicant: Panasonic Intellectual Property Management Co., Ltd., Osaka (JP)

(72) Inventors: Shinya Nishikawa, Osaka (JP); Tomokazu Sada, Nara (JP); Takashi Iida, Hyogo (JP); Masaaki Takegata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 256 days.

(21) Appl. No.: 17/759,913

(22) PCT Filed: Dec. 28, 2020

(86) PCT No.: PCT/JP2020/049229
§ 371 (c)(1),
(2) Date: Aug. 1, 2022

(87) PCT Pub. No.: WO2021/166465
PCT Pub. Date: Aug. 26, 2021

(65) Prior Publication Data
US 2023/0065968 A1    Mar. 2, 2023

(30) Foreign Application Priority Data
Feb. 21, 2020  (JP) .................. 2020-028220

(51) Int. Cl.
*G01R 31/396* (2019.01)
*G01R 31/374* (2019.01)
(Continued)

(52) U.S. Cl.
CPC ......... *G01R 31/396* (2019.01); *G01R 31/374* (2019.01); *G01R 31/3828* (2019.01); *G01R 31/387* (2019.01); *G01R 31/392* (2019.01)

(58) Field of Classification Search
CPC .. G01R 31/396; G01R 31/387; G01R 31/392; G01R 31/3828; G01R 31/374
See application file for complete search history.

(56) References Cited

U.S. PATENT DOCUMENTS

| | | | |
|---|---|---|---|
| 6,924,623 B2 * | 8/2005 | Nakamura | H01M 10/4242 320/132 |
| 2012/0121952 A1 * | 5/2012 | Majima | G01R 31/392 429/90 |

(Continued)

FOREIGN PATENT DOCUMENTS

| | | |
|---|---|---|
| CN | 107431255 A | 12/2017 |
| JP | 2012-132761 | 7/2012 |

(Continued)

OTHER PUBLICATIONS

International Search Report of PCT application No. PCT/JP2020/049229 dated Mar. 16, 2021.

(Continued)

*Primary Examiner* — Walter L Lindsay, Jr.
*Assistant Examiner* — Milton Gonzalez
(74) *Attorney, Agent, or Firm* — Rimon P.C.

(57) ABSTRACT

In a calculation system, a data acquisition unit is configured to acquire operation data of a battery, the operation data including at least voltages and currents measured by a management device at a plurality of time points, and states of charge (SOCs) estimated based on at least one of the voltages and the currents, the management device being configured to manage the battery. An extraction unit is configured to, extract, as sample data, a set of an SOC and a voltage from sets of the SOCs and the voltages the plurality of time points included in the operation data in a period in which the battery is regarded as resting, the period being specified based on the currents. An estimation unit is configured to estimate an SOC-open circuit voltage (OCV) characteristic of the battery based on the extracted sample data.

13 Claims, 9 Drawing Sheets

(51) Int. Cl.
    *G01R 31/3828*    (2019.01)
    *G01R 31/387*     (2019.01)
    *G01R 31/392*     (2019.01)

(56) References Cited

U.S. PATENT DOCUMENTS

| | | | |
|---|---|---|---|
| 2014/0232411 A1* | 8/2014 | Vaidya | G01R 31/392 |
| | | | 324/426 |
| 2018/0006335 A1 | 1/2018 | Fujita et al. | |
| 2018/0313906 A1 | 11/2018 | Takahashi et al. | |
| 2019/0207267 A1 | 7/2019 | Vickery et al. | |
| 2021/0367277 A1* | 11/2021 | Takechi | H01M 10/482 |

FOREIGN PATENT DOCUMENTS

| | | | |
|---|---|---|---|
| JP | 2014-134391 | 7/2014 | |
| JP | 2015-184194 | 10/2015 | |
| JP | 2017-085755 | 5/2017 | |
| JP | 2018-185259 | 11/2018 | |
| JP | 2019-153576 | 9/2019 | |
| WO | WO-2018181620 A1 * | 10/2018 | G01R 31/36 |

OTHER PUBLICATIONS

English Translation of Chinese Office Action dated Feb. 21, 2025 for the related Chinese Patent Application No. 202080096413.8.

* cited by examiner

CALCULATION SYSTEM, BATTERY CHARACTERISTIC ESTIMATION METHOD, AND BATTERY CHARACTERISTIC ESTIMATION PROGRAM

CROSS-REFERENCE TO RELATED APPLICATIONS

This application is a U.S. national stage application of the PCT International Application No. PCT/JP2020/049229 filed on Dec. 28, 2020, which claims the benefit of foreign priority of Japanese patent application No. 2020-028220 filed on Feb. 21, 2020, the contents all of which are incorporated herein by reference.

TECHNICAL FIELD

The present invention relates to a calculation system, a battery characteristic estimation method, and a battery characteristic estimation program configured to estimate characteristic of a cell such as a lithium-ion battery.

BACKGROUND ART

Hybrid vehicles (HV), plug-in hybrid vehicles (PHV), and electric vehicles (EV) have become widespread in recent years. These electric vehicles have a secondary battery such as a lithium ion battery mounted as a key device. In the secondary battery mounted on the electric vehicle, it is important to determine a full charge capacity (FCC) accurately. If the FCC is determined accurately, a degree of degradation (state of health (SOH)) can be estimated accurately, and the remaining cruising range of the electric vehicle, the replacement timing of the secondary battery mounted on the electric vehicle, and the reusable value at the time of replacement are predicted accurately.

The FCC is generally calculated based on a state of charge (SOC)—open circuit voltage (OCV) characteristic (SOC-OCV curve) defining a relationship between the OCV and the SOC, two OCVs, and a current integrated amount between the two OCVs.

There are a wide variety of vehicle models of electric vehicles, and a wide variety of secondary batteries are used. In order to estimate the FCCs of the wide variety of secondary batteries with high accuracy, it is necessary to acquire SOC-OCV curves of all types of secondary batteries.

Business operators such as delivery companies, taxi companies, and rental car companies that operate using a wide variety of electric vehicles need to accurately obtain the FCC and the SOH of secondary batteries of electric vehicles owned in terms of management. However, electric vehicles often have specifications in which the SOC-OCV curve, the FCC, and the SOH are not output to the outside, and it is difficult for the business operator to easily obtain the FCC and the SOH of secondary batteries of the electric vehicles owned.

It is not realistic for the business operator to collect operation data of the wide variety of secondary batteries and create an SOC-OCV curve of each secondary battery by oneself because the SOC-OCV curve is costly in terms of time and money. In addition, even a battery manufacturer requires cost to collect operation data of secondary batteries of other companies by an acceleration test of an electric vehicle or the like.

As a related technique, a method has been proposed in which an OCV-full-charge capacity characteristic defining a relationship between the OCV and the full-charge capacity is held in a table for each SOC, and the full-charge capacity of a certain SOC is estimated with reference to the OCV-full-charge capacity characteristic of the SOC (see, for example, PTL 1). In addition, a method of correcting the SOC-OCV curve according to characteristic degradation has been proposed (see, for example, PTL 2). Both methods require a base SOC-OCV curve, and acquiring the SOC-OCV curve is costly.

CITATION LIST

Patent Literatures

PTL 1: Japanese Patent Laid-Open Publication No. 2012-132761
PTL 2: Japanese Patent Laid-Open Publication No. 2014-134391

SUMMARY OF THE INVENTION

Technical Problem

The present invention has been conceived in light of such circumstances, and an object thereof is to provide a technique acquiring the battery characteristic at low cost.

Solution to Problem

In order to solve the above problem, a calculation system according to one aspect of the present disclosure includes: a data acquisition unit configured to acquire operation data of a battery, the operation data including at least voltages and currents measured by a management device at a plurality of time points, and states of charge (SOCs) estimated based on at least one of the voltages and the currents, the management device being configured to manage the battery; an extraction unit configured to, extract, as sample data, a set of an SOC and a voltage from sets of the SOCs and the voltages the plurality of time points included in the operation data in a period in which the battery is regarded as resting, the period being specified based on the currents; and an estimation unit configured to estimate an SOC-open circuit voltage (OCV) characteristic of the battery based on the extracted sample data.

Any combinations of the constituent elements described above and modifications of the features of the present disclosure in methods, devices, systems, computer programs, and the like are still effective as aspects of the present disclosure.

Advantageous Effect of Invention

According to the present disclosure, the characteristic of the battery can be acquired at low cost.

DESCRIPTION OF EMBODIMENT

Figure 1:
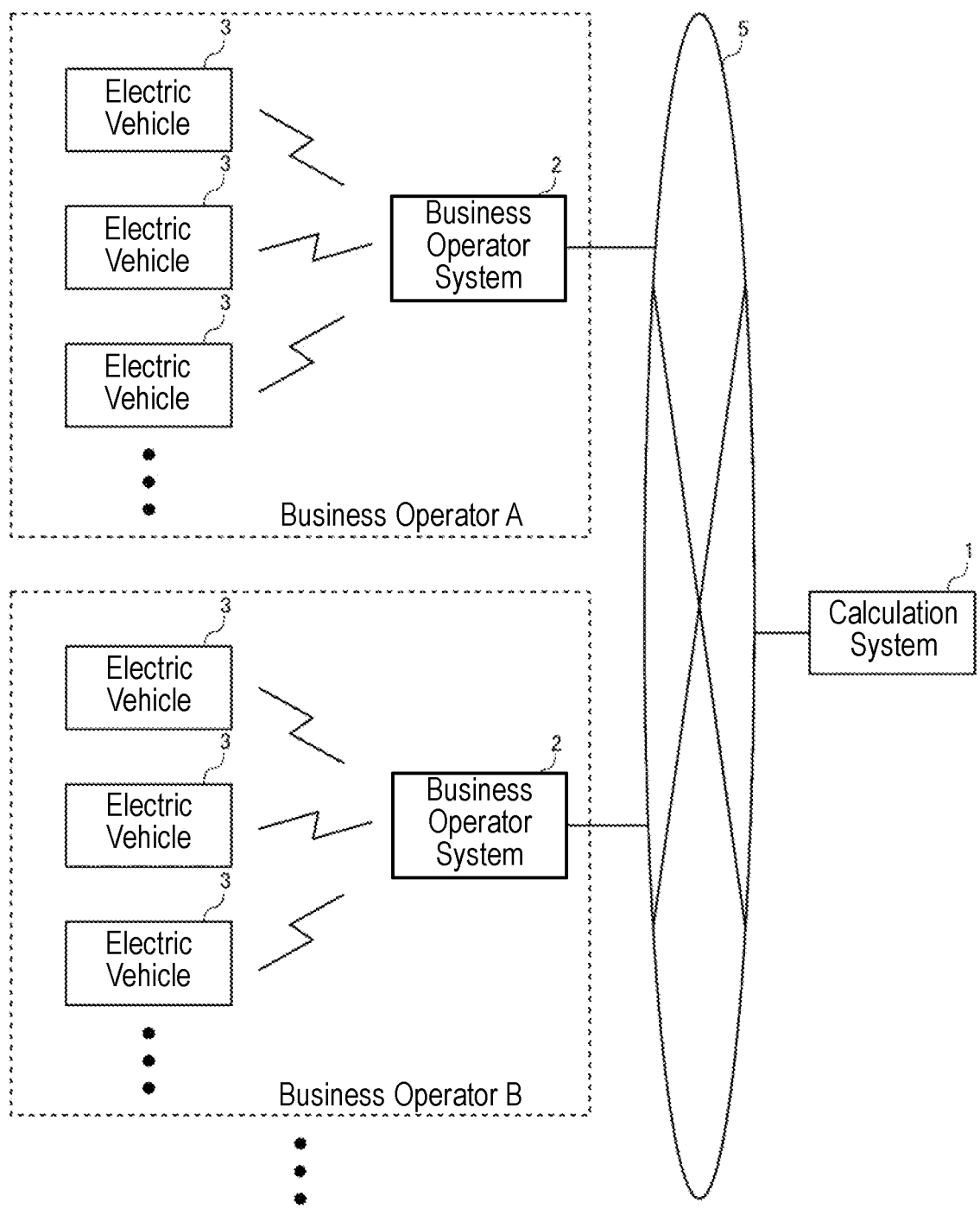
FIG. 1 illustrates a calculation system used by business operator systems according to an exemplary embodiment.

FIG. 1 is a diagram for explaining calculation system 1 used by plural business operator systems 2 according to an exemplary embodiment. Each of the plurality of business operators A and B has plural electric vehicles 3 and runs a business using the electric vehicles 3. For example, each business operator uses plural electric vehicles 3 to run a delivery business (home delivery business), a taxi business, a rental car business, or a car sharing business. In the present exemplary embodiment, a pure EV without an engine is assumed as electric vehicle 3. In the present exemplary embodiment, it is assumed that each business operator owns plural vehicle models of electric vehicles 3.

Each of business operators A and B includes business operator system 2. Business operator system 2 is a system for managing the operation of each of business operators A and B. Business operator system 2 is constituted of one or plural information processing devices (for example, servers and personal computers (PCs)). A part or all of the information processing devices which constitute business operator system 2 may be present in a data center. For example, business operator system 2 may be constituted by combining a server (own business server, cloud server, or rental server) in the data center and a client PC in a business site.

Calculation system 1 is implemented by one or plural information processing devices installed in the data center. Business operator system 2 accesses calculation system 1 via network 5. Network 5 is a general term of communication paths such as the Internet and leased lines, regardless of a communication medium or a protocol.

The plurality of electric vehicles 3 are parked in a parking lot or a garage of a business office of each of business operators A and B during waiting. The plurality of electric vehicles 3 has a wireless communication function and can perform wireless communication with business operator system 2. The plurality of electric vehicles 3 transmits travel data including operation data of an on-board secondary battery to business operator system 2. While traveling, electric vehicle 3 may wirelessly transmit the travel data to a server constituting business operator system 2 via network 5. For example, the travel data may be transmitted at a frequency of once every 10 seconds. Alternatively, the travel data for one day may be transmitted in batch at a predetermined timing once a day (for example, at the end of business hours).

In addition, in the case where business operator system 2 is constituted of an own business server or a PC installed in the business office, electric vehicle 3 may transmit travel data for one day to the own business server or the PC after returning to the business office after the end of business hours. In that case, the travel data may be wirelessly transmitted to the own business server or the PC, or may be connected to the own server or PC by wire and transmitted via wired communication. Alternatively, the travel data may be transmitted to the own business server or the PC via a recording medium in which the travel data is recorded. In the case where business operator system 2 includes a combination of a cloud server and a client PC in the business office, electric vehicle 3 may transmit the travel data to the cloud server via the client PC in the business office.

Figure 2:
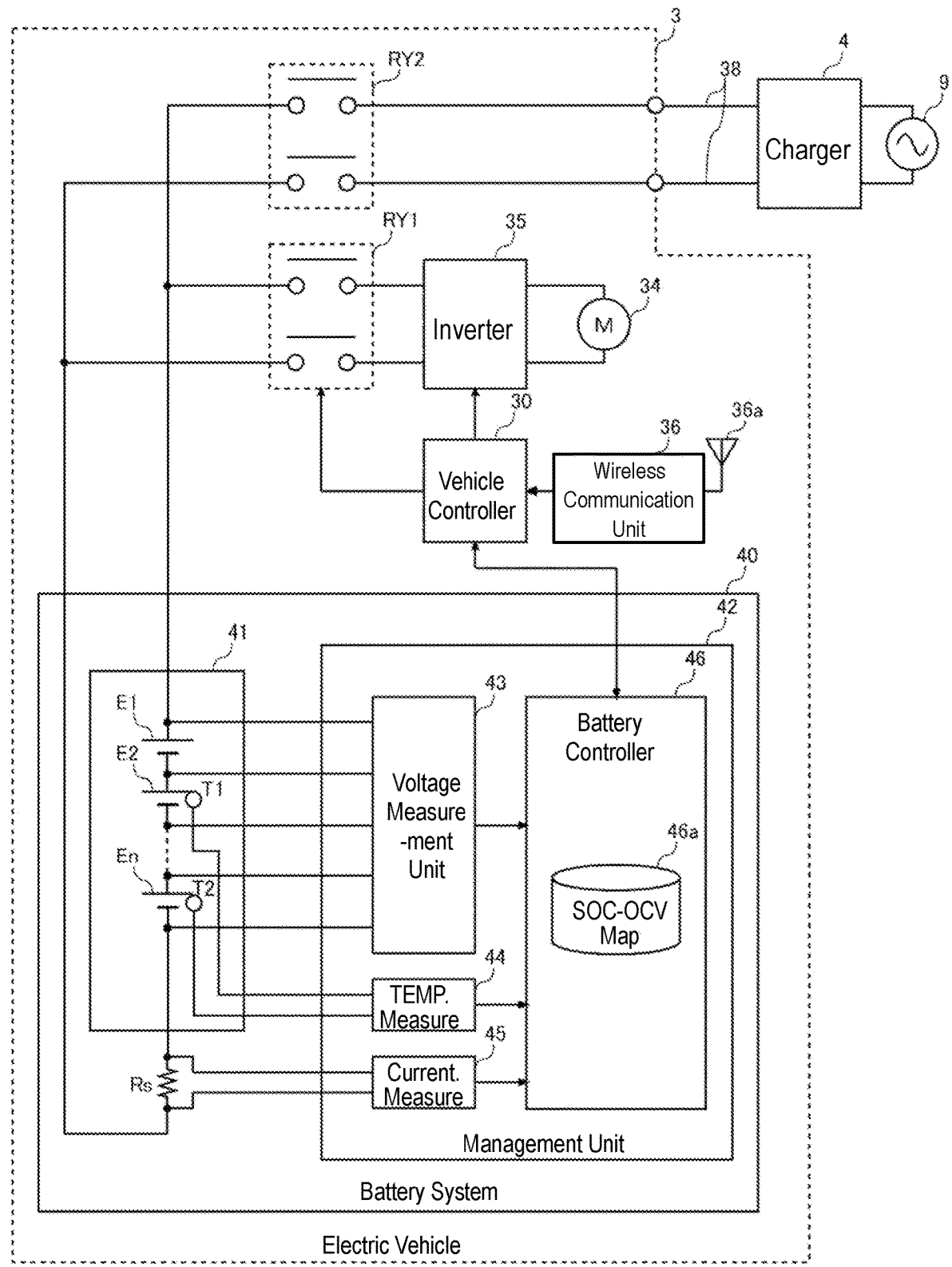
FIG. 2 illustrates a detailed configuration of a battery system mounted on an electric vehicle.

FIG. 2 is a diagram for explaining a detailed configuration of battery system 40 mounted on electric vehicle 3. Battery system 40 is connected to motor 34 through first relay RY1 and inverter 35. Inverter 35 converts direct-current (DC) power supplied from battery system 40 into alternating-current (AC) power and supplies the power to motor 34 during power running. During regeneration, the AC power supplied from motor 34 is converted into the DC power and supplied to battery system 40. Motor 34 is a three-phase AC motor, and rotates in accordance with the AC power supplied from inverter 35 during power running. During regeneration, rotational energy due to deceleration is converted into the AC power and supplied to inverter 35.

First relay RY1 is a contactor provided in wiring connecting battery system 40 to inverter 35. Vehicle controller 30 controls first relay RY1 to turn on the relay (closed state) during traveling, and electrically connects battery system 40 to a power system of electric vehicle 3. Vehicle controller 30 generally controls first relay RY1 to turn off the relay (open state) during non-traveling, and electrically interrupts battery system 40 from the power system of electric vehicle 3. Instead of the relay, another type of switch such as a semiconductor switch may be used.

Battery system 40 is configured to be charged from commercial power system 9 by being connected to charger 4 installed outside electric vehicle 3 with charging cable 38. Charger 4 is connected to commercial power system 9 and charges battery system 40 in electric vehicle 3 with charging cable 38. In electric vehicle 3, second relay RY2 is provided in wiring connecting battery system 40 to charger 4. Instead of the relay, another type of switch such as a semiconductor switch may be used. Management unit 42 of battery system 40 controls second relay RY2 to turn on the relay (closed state) before start of charging, and turn off the relay (open state) after the end of charging.

In general, an alternating current is used for normal charging, and a direct current is used for quick charging. In the case of using the alternating current for charging, the AC power is converted to the DC power by an AC/DC converter (not shown) interposed between second relay RY2 and battery system 40.

Battery system 40 includes battery module 41 and management unit 42. Battery module 41 includes plural cells E1 to En connected in series to one another. Battery module 41 may include plural battery modules connected in series or series/parallel to one another. For each of the cells, a lithium-ion battery cell, a nickel hydrogen battery cell, a lead battery cell, or the like can be used. Hereinafter, in the present description, an example where a lithium ion battery cell (nominal voltage of 3.6 V to 3.7 V) is used is assumed. The number of series connections of cells E1 to En is determined in accordance with a drive voltage of motor 34.

Shunt resistor Rs is connected in series with the cells E1 to En. Shunt resistor Rs functions as a current detection element. Instead of shunt resistor Rs, a Hall element may be used. In addition, in battery module 41 plural temperature sensors T1 and T2 for detecting temperature of the plurality of cells E1 to En are provided. One temperature sensor may be provided in the battery module, or one temperature sensor may be provided for each of the plurality of cells. For example, a thermistor may be used for temperature sensors T1 and T2.

Management unit 42 includes voltage measurement unit 43, temperature measurement unit 44, current measurement unit 45, and battery controller 46. Each of nodes between cells E1 to En connected in series to one another is connected to voltage measurement unit 43 with a corresponding one of voltage lines. Voltage measurement unit 43 measures a voltage of each of cells E1 to En by measuring voltage between two adjacent voltage lines. Voltage measurement unit 43 transmits the measured voltage of each of cells E1 to En to battery controller 46.

Since voltage measurement unit 43 has a higher voltage than battery controller 46, voltage measurement unit 43 is connected to battery controller 46 with a communication line while being isolated from the controller. Voltage measurement unit 43 can be constituted of an application specific integrated circuit (ASIC) or a general-purpose analog front-end integrated circuit (IC). Voltage measurement unit 43 includes a multiplexer and an A/D converter. The multiplexer outputs the voltage between two adjacent voltage lines to the A/D converter in order from the top. The A/D converter converts an analog voltage input from the multiplexer into a digital value.

Temperature measurement unit 44 includes a voltage dividing resistor and an A/D converter. The A/D converter sequentially converts plural analog voltage values divided by the plural temperature sensors T1 and T2 and the voltage dividing resistors into digital values, and outputs the digital values to battery controller 46. Battery controller 46 estimates temperatures of the cells E1 to En based on the digital values. For example, battery controller 46 estimates the temperature of each of cells E1 to En based on a value measured by the temperature sensor closest to the corresponding one of cells E1 to En.

Current measurement unit 45 includes a differential amplifier and an A/D converter. The differential amplifier amplifies a voltage across shunt resistor Rs and outputs the voltage to the A/D converter. The A/D converter converts the voltage received from the differential amplifier into a digital value and outputs the digital value to battery controller 46. Battery controller 46 estimates a current flowing through the cells E1 to En based on the digital value.

In the case where an A/D converter is mounted in battery controller 46 and an analog input port is provided in battery controller 46, temperature measurement unit 44 and current measurement unit 45 may output analog voltage values to battery controller 46, and the A/D converter in battery controller 46 may convert the analog voltage values into digital values.

Battery controller 46 manages a state of each of the plurality of cells E1 to En based on the voltage, the temperature, and the current of each of cells E1 to En measured by voltage measurement unit 43, temperature measurement unit 44, and current measurement unit 45, respectively. Battery controller 46 is connected to vehicle controller 30 through an in-vehicle network. For example, a controller area network (CAN) or a localinterconnect network (LIN) can be used as the in-vehicle network.

Battery controller 46 may be constituted of a microcomputer and a non-volatile memory (e.g., an electrically erasable programmable read-only memory (EEPROM), or a flash memory). SOC-OCV map 46a is held in the non-volatile memory. SOC-OCV map 46a describes characteristic data of SOC-OCV curves of the plurality of cells E1 to En. The SOC-OCV curves of the plurality of cells E1 to En are created in advance by a battery manufacturer and registered in the nonvolatile memory at the time of shipment. The battery manufacturer conducts various tests to derive the SOC-OCV curves of cells E1 to En.

Battery controller 46 estimates the SOC, the FCC, and the SOH of each of the cells E1 to En. Battery controller 46 estimates the SOC by combining an OCV method and a current integration method. The OCV method is used to estimate the SOC based on the OCV of each of cells E1 to En measured by voltage measurement unit 43 and the characteristic data of the SOC-OCV curve described in SOC-OCV map 46a. The current integration method is used to estimate the SOC based on the OCV at the start of charging and discharging of each of cells E1 to En and an integrated value of a current measured by current measurement unit 45. In the current integration method, a measurement error of current measurement unit 45 accumulates as the charge and discharge time increases. Thus, the SOC estimated by the current integration method is preferably corrected using the SOC estimated by the OCV method.

Battery controller 46 estimates the FCC of the cell based on the characteristic data of the SOC-OCV curve described in SOC-OCV map 46a and two OCVs for the cell measured by voltage measurement unit 43.

Figure 3:
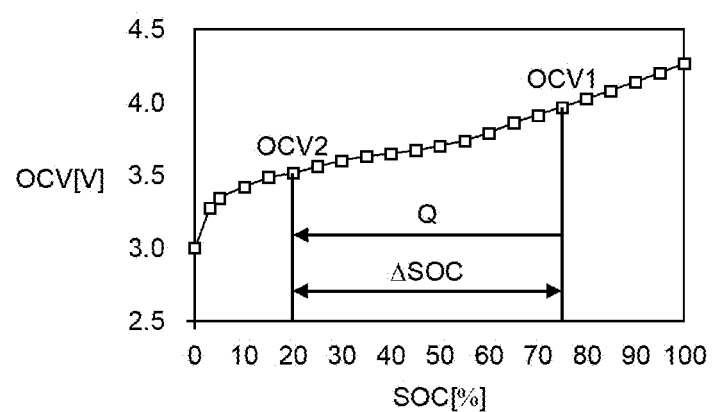
FIG. 3 illustrates an estimation method of an FCC.

FIG. 3 is a diagram for explaining a method of estimating the FCC. Battery controller 46 acquires two OCVs of the cell. Battery controller 46 refers to the SOC-OCV curve to identify two SOCs corresponding to two voltages, respectively, and calculates a difference ΔSOC between the two SOCs. In the example shown in FIG. 3, the two SOCs are 20% and 75%, and the 66 SOC is 55%.

Based on the change of the current measured by current measurement unit 45, battery controller 46 calculates current integrated amount Q(=charge and discharge quantity of electricity) in a period between the two time points at which the two OCVs are acquired. Battery controller 46 estimates the FCC by calculating the following Equation 1.

$$FCC = Q/\Delta SOC \quad \text{(Equation 1)}$$

The SOH is defined as a ratio of the present full charge capacity (FCC) to the initial FCC. The lower the value of SOH (closer to 0%) is, the more the degradation progresses. Battery controller 46 estimates the SOH by calculating the following Equation 2.

$$SOH = \text{Current FCC/Initial FCC} \quad \text{(Equation 2)}$$

The SOH may be obtained by capacity measurement by complete charging and discharging, or may be obtained by adding storage degradation and cycle degradation. The storage degradation can be estimated based on the SOC, a temperature, and a storage degradation rate. The cycle degradation can be estimated based on an SOC range that is used, a temperature, a current rate, and a cycle degradation rate. The storage degradation rate and the cycle degradation rate can be derived previously by experiments or simulations. The SOC, the temperature, the SOC range, and the current rate can be determined by measurement.

The SOH can also be estimated based on a correlation with an internal resistance of the cell. The internal resistance can be estimated by dividing a voltage drop of the cell generated due to a predetermined current flowing through the cell for a predetermined duration, by the current value. The internal resistance decreases as the temperature rises, and increases as the SOH decreases.

Battery controller 46 transmits the voltage, the temperature, the current, the SOC, the FCC, and the SOH of the cells E1 to En to vehicle controller 30 via the in-vehicle network. Vehicle controller 30 generates operation data of the cells E1 to En including identification information, type information, the voltage, the current, the temperature, the SOC, and measurement time of the plurality of cells E1 to En, and travel data including identification information and vehicle model information of electric vehicle 3. The operation data of the cells E1 to En does not include the FCC and the SOH. The travel data may include data such as speed data and traveling position data of electric vehicle 3. Further, the function of estimating the SOC, the FCC, and the SOH is not limited to being provided in battery controller 46. In the case where battery controller 46 does not have the function of estimating the SOC, calculation system 1 or business operator system 2 may have the function of estimating the SOC. In this case, calculation system 1 and business operator system 2 preferably have the function of estimating the FCC and the SOH.

Wireless communication unit 36 performs signal processing to wirelessly connect to network 5 via antenna 36a. In the present exemplary embodiment, wireless communication unit 36 wirelessly transmits the travel data acquired from vehicle controller 30 to business operator system 2. Examples of a wireless communication network to which electric vehicle 3 can wirelessly connect include a cellular phone network (cellular network), a wireless local area network (LAN), an electronic toll collection system (ETC), dedicated short range communications (DSRC), Vehicle-to-Infrastructure (V2I), and Vehicle-to-Vehicle (V2V).

Figure 4:
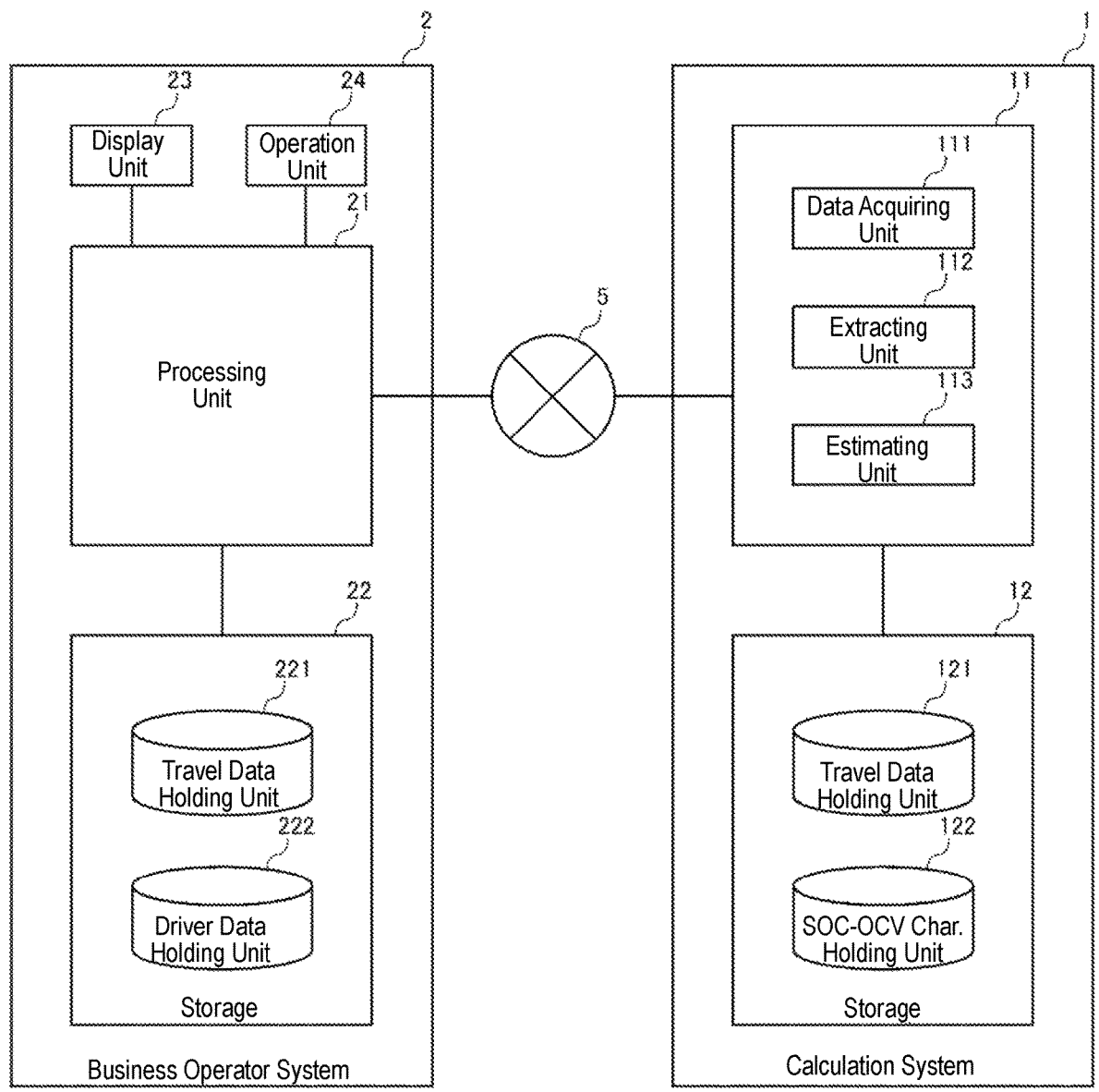
FIG. 4 illustrates the estimation method of the FCC.

FIG. 4 is a diagram illustrating a configuration example of business operator system 2 and calculation system 1 shown in FIG. 1. Business operator system 2 includes processor 21, storage 22, display unit 23, and operation unit 24. The function of processor 21 can be achieved by cooperation of a hardware resource and a software resource, or by the hardware resource alone. As the hardware resources, a central processing unit (CPU), a read only memory (ROM), a random access memory (RAM), a graphics processing unit (GPU), an ASIC, a field programmable gate array (FPGA), and other large-scale integrations (LSIs) can be used. As the software resources, an operating system, an application, and other programs can be used. Storage 22 includes travel data holding unit 221 and driver data holding unit 222. Storage 22 includes a nonvolatile recording medium such as a hard disk drive (HDD) and a solid state drive (SSD), and records various types of programs and data.

Travel data holding unit 221 stored travel data collected from the electric vehicles 3 owned by the business operator. Driver data holding unit 222 stores data of a plurality of drivers belonging to the business operator. For example, the cumulative travel distance of each electric vehicle 3 that is driven is managed for each driver.

Display unit 23 includes a display such as a liquid crystal display or an organic EL display, and displays an image generated by processor 21 thereon. Operation unit 24 is a user interface such as a keyboard, a mouse, and a touch panel, and accepts operations of a user of business operator system 2.

Business operator system 2 can provide the travel data of the plurality of electric vehicles 3 held in travel data holding unit 221 to calculation system 1. The data is provided based on a contract between each of business operators A and B and an operating entity of calculation system 1. This contract may be a contract in which each of business operators A and B receives a financial consideration in return for data provision, or may be a contract in which each of business operators A and B receives a benefit related to service use in return for data provision. Alternatively, each of business operators A and B may provide the travel data for free.

The business operator system 2 can request calculation system 1 to estimate the FCC of battery module 41 mounted on electric vehicle 3 owned by the business operator. This FCC estimation service may be paid or free. For example, the service may be a service that can be used by the business operator for free in return for data provision.

Calculation system 1 includes processor 11 and storage 12. Processor 11 includes data acquisition unit 111, extraction unit 112, and estimation unit 113. The function of processor 11 can be achieved by cooperation of a hardware resource and a software resource, or by the hardware resource alone. A CPU, a GPU, a ROM, a RAM, an ASIC, an FPGA, and other LSIs can be used as the hardware resources. As the software resources, an operating system, an application, and other programs can be used. Storage 12 includes travel data holding unit 121 and SOC-OCV characteristic holding unit 122. Storage 22 includes a nonvolatile recording medium such as an HDD or an SSD, and records various types of programs and data.

Travel data holding unit 121 holds travel data collected from the electric vehicles 3 collected by each of business operators A and B. SOC-OCV characteristic holding unit 122 holds the SOC-OCV characteristic of the cell created by processor 11 based on the collected travel data for each cell type.

Data acquisition unit 111 acquires travel data of electric vehicles 3 from the business operators A and B, and stores the acquired travel data in travel data holding unit 121. Extraction unit 112 extracts, as sample data, sets of SOC and voltage at a plurality of time points included in operation data of at least one cell and held in travel data holding unit 121. At that moment, extraction unit 112 extracts the sets of SOCs and voltages in a period in which the voltages are regarded as the OCV (that is, a period in which the cell is regarded as resting).

The secondary battery is an electrochemical product, in which a measured voltage rises nonlinearly when a charging current flows therethrough, and the measured voltage drops nonlinearly when a discharge current flows therethrough. A voltage measured when the current flows through the secondary battery is a closed circuit voltage (CCV) containing an overvoltage component, and has a value different from the OCV. In a general lithium-ion battery cell, the measured voltage converges to the vicinity of the OCV not containing the overvoltage component, in about 30 seconds after the end of charging and discharging. The time until the voltage converges to the vicinity of the OCV depends on the material used for the negative electrode. For example, in the negative electrode material mixed with silicon, it takes one hour or more to converge to the vicinity of the OCV.

Extraction unit 112 may extract, from the sets of SOC and voltage at the plurality of time points, a set of SOC and voltage included in a period in which the value of the current is zero and a predetermined time (for example, 30 seconds) has elapsed from the end of charging and discharging (after the value of the current becomes zero).

Figure 5A:
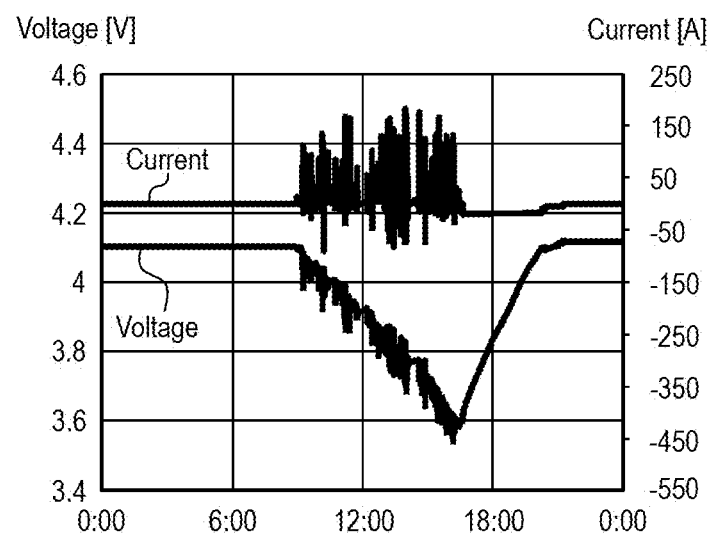
FIG. 5A illustrates an example of travel data.
Figure 5B:
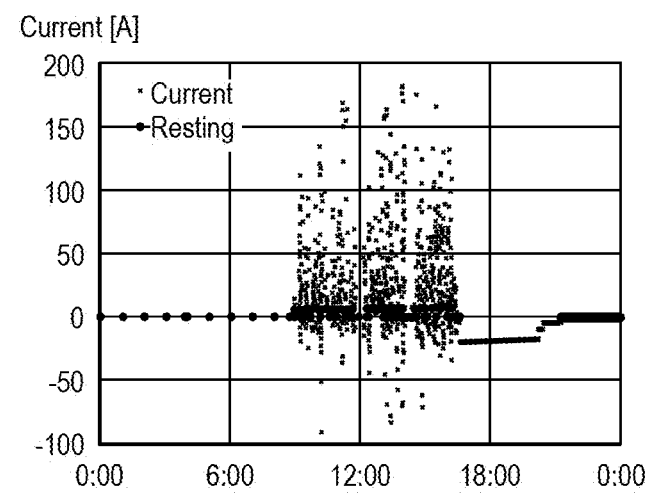
FIG. 5B illustrates an example of travel data obtained by a display method different from that in FIG. 5A.

FIGS. 5A and 5B are diagrams each showing an example of the travel data. FIG. 5A is a diagram showing an example of transition of the voltage and the current included in travel data for a certain day. FIG. 5B is a diagram plotting measurement points of the current in the certain day. Small circles denote the measurement points of the current measured while electric vehicle 3 is traveling. Large circles denote measurement points of the current measured while electric vehicle 3 is stopping. That is, the large circle denotes a resting point where no current flows. As shown in FIGS. 5A and 5B, a lot of resting points are contained in the travel data, and a lot of voltages that can be regarded as the OCVs are acquired from the travel data.

In order to increase the number of samples that can be extracted, the extraction conditions may be expanded. Extraction unit 112 may also set, as an extraction target, a set of SOC and voltage in a period in which a current value less than or equal to a set value (for example, 1 A or 0.1 C) continues for a time more than or equal to a set time (for example, one minute). That is, in this case, a period in which a current at a charge and discharge rate of less than or equal to 0.1 C or a current of less than or equal to 1 A continues for one minute in battery module 41 is defined as a period that can be regarded as the OCV or a period in which the cell is regarded as resting.

In addition, in order to increase the number of samples that can be extracted, extraction unit 112 may correct the measured voltage on the basis of the convergence characteristic of a polarization voltage of the cell and sample the corrected voltage during a period from the end of charging to the cell or discharging from the cell until the measured voltage converges to the OCV.

Figure 6:
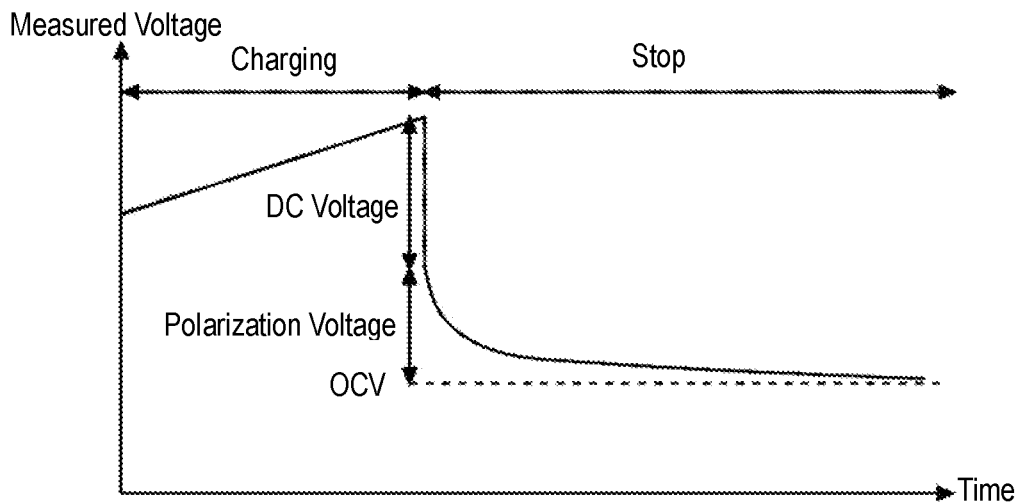
FIG. 6 illustrates an example of behavior of a measured voltage when charging of a battery cell is stopped.

FIG. 6 is a diagram showing an example of behavior of the measured voltage when the charging of the cell is stopped. When charging is performed at a constant current rate from charger 4, the measured voltage of the cell gradually increases. When the charging is stopped, a DC resistance while the current flows through the solution or the electrode and an increase in DC voltage based on the charging current disappear, and the measured voltage decreases by an amount of the increase in DC voltage. Then, the polarization voltage (overvoltage component) gradually decreases, and the measured voltage converges to the OCV.

In contrast, in the case of discharging, when the discharge current is stopped, the DC resistance while the current flows through the solution or the electrode and a decrease in DC voltage based on the discharge current disappear, and the measured voltage increases by an amount of the decrease in DC voltage. Then, the polarization voltage (overvoltage component) gradually increases, and the measured voltage converges to the OCV.

A developer of calculation system 1 previously prepares a convergence curve having time as a variable of the polarization voltage of the cell after the end of charging. The convergence curve may be described by a function or may be described by a table. Extraction unit 112 estimates the polarization voltage at each time based on the convergence curve of the polarization voltage after the end of charging and the elapsed time from the end of charging, and subtracts the estimated polarization voltage from the measured voltage to derive a voltage that can be considered as the OCV.

Similarly, the developer of calculation system 1 prepares in advance a convergence curve having time as a variable of the polarization voltage of the cell after the end of discharging. Extraction unit 112 estimates the polarization voltage at each time based on the convergence curve of the polarization voltage after the end of discharging and the elapsed time from the end of discharging, and adds the estimated polarization voltage to the measured voltage to derive a voltage that can be considered as the OCV.

The convergence curve of the polarization voltage depends on the negative electrode material, the temperature, and the degree of degradation. The developer of calculation system 1 may map and prepare the convergence curve of the polarization voltage in at least one category among a negative electrode material category, a temperature category, and a degree of degradation category. In the case where the operation data of each cell does not include the SOH, but the operation data of each cell includes identification information for uniquely specifying each cell, a cumulative value of the charge and discharge current of each cell can be calculated. In addition, the start date of use for each cell can be specified. Extraction unit 112 can estimate the degree of degradation of the cell based on a period of using the cell and the cumulative value of the charge and discharge current.

Estimation unit 113 generates an approximate curve based on the sample data at the plural time points extracted by extraction unit 112, and estimates the SOC-OCV characteristic of the cell. Estimation unit 113 stores the estimated SOC-OCV characteristic in SOC-OCV characteristic holding unit 122. Estimation unit 113 estimates the SOC-OCV characteristic for each cell type based on the sample data of the plurality of cells of the same type. Estimation unit 113 may estimate the SOC-OCV of a particular cell based on the sample data of the particular cell. In addition, the SOC-OCV of battery module 41 may be estimated by estimation unit 113 by adding up the estimated OCVs of the respective cells.

Estimation unit 113 may separately generate the SOC-OCV characteristic for charging of the cell and the SOC-OCV characteristic for discharging of the cell. In this case, extraction unit 112 separately extracts a set of SOC and voltage in the period in which the cell is regarded as resting after the end of charging the cell, and a set of SOC and voltage in the period in which the cell is regarded as resting state after the end of discharging the cell.

Estimation unit 113 may estimate the SOC-OCV characteristic based only on the sample data of the cell whose period of use is shorter than a predetermined period (for example, one year). The SOC estimated by management unit 42 of electric vehicle 3 has relatively high accuracy in a state where the cell is almost as good as new. As the period of using the cell becomes longer, the accuracy of the SOC estimated by management unit 42 generally decreases. In particular, in management unit 42 that does not have a mechanism for updating the held SOC-OCV characteristic according to the period of using the cell, the accuracy of the SOC tends to decrease more.

From the above, the estimation accuracy of the SOC-OCV characteristic is higher in the case of estimating the SOC-OCV characteristic based only on the sample data of the cell having the short period of use than in the case of estimating the SOC-OCV characteristic based on the sample data in the entire period. Instead of using the cell whose period of use is shorter than the predetermined period, the SOC-OCV characteristic may be estimated based only on the sample data of the cell in which the cumulative value of the charge and discharge current of the cell is smaller than the predetermined value.

Similarly to the estimation of the SOC-OCV characteristic of the cell, the SOC-OCV characteristic of battery module 41 can be estimated based on the voltage, the current, the temperature, and the SOC of the plurality of cells E1 to En. The phrase of battery used in the claims includes both the cell and battery module 41.

The SOC-OCV characteristic of the cell depends on the temperature and the degree of degradation. Extraction unit 112 may classify and extract the sample data of the cell based on at least one of the temperature category and the degree of degradation category. Estimation unit 113 may generate the SOC-OCV characteristic of the cell by mapping at least one category among the temperature category and the degree of degradation category based on the sample data classified for each category. In the case where the operation data of each cell includes the identification information for uniquely specifying each cell, the degree of degradation of each cell can be estimated based on the cumulative value of the charge and discharge current.

Figure 7:
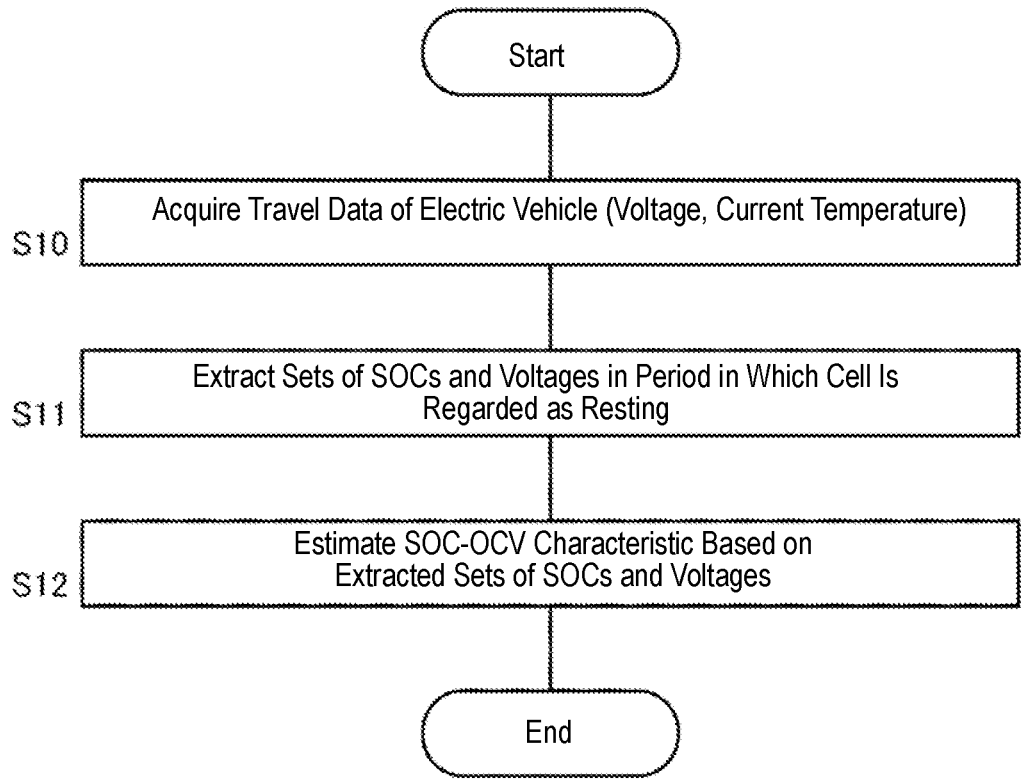
FIG. 7 is a flowchart illustrates a flow of SOC-OCV characteristic estimation processing of a cell by the calculation system.

FIG. 7 is a flowchart showing SOC-OCV characteristic estimation processing of the cell by calculation system 1. Data acquisition unit 111 acquires the travel data (voltage, current, SOC, and temperature of the cell) of electric vehicle 3 from business operator system 2 (S10). Data acquisition unit 111 stores the acquired travel data in travel data holding unit 121. Extraction unit 112 extracts sets of SOCs and voltages in the period in which the cell is regarded as resting based on the travel data held in travel data holding unit 121 (S11). Estimation unit 113 generates an approximate curve based on the plural extracted sets of SOCs and voltages, and estimates the SOC-OCV characteristic (S12). Estimation unit 113 stores the estimated SOC-OCV characteristic in SOC-OCV characteristic holding unit 122.

Figure 8:
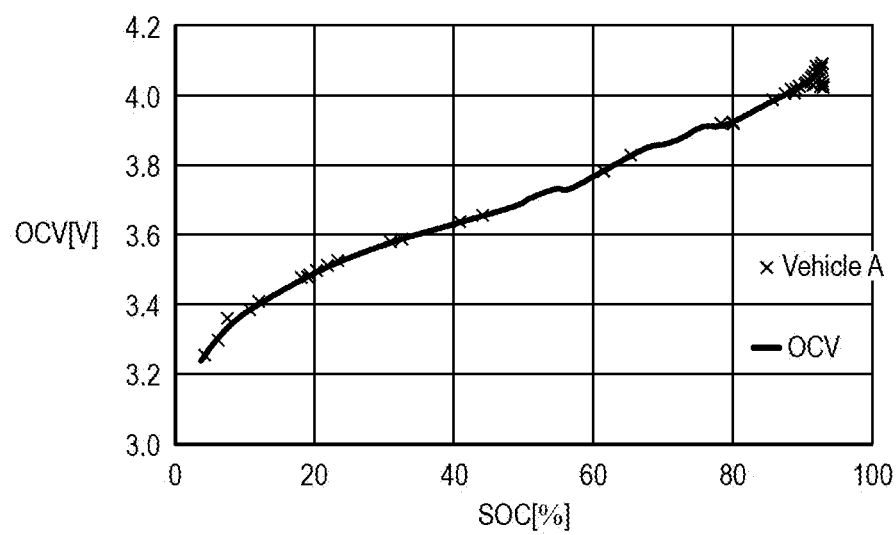
FIG. 8 illustrates an example of an SOC-OCV characteristic actually estimated from the travel data of one electric vehicle.
Figure 9:
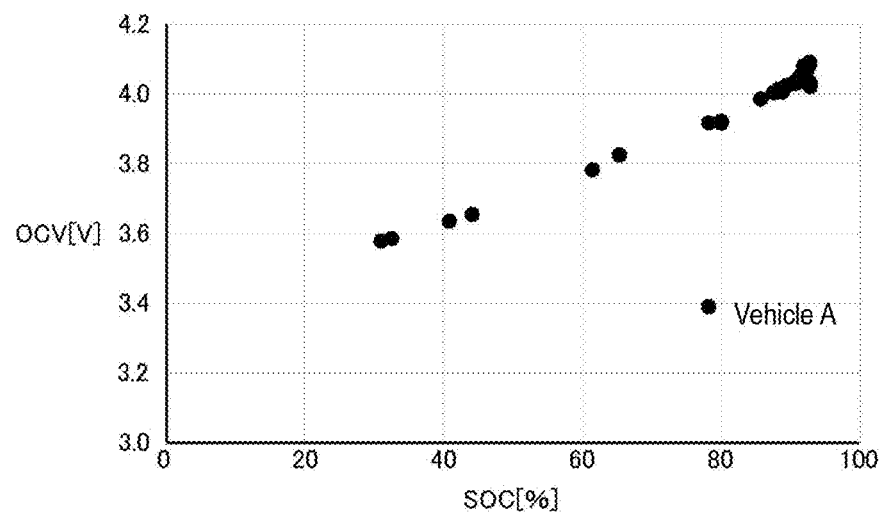
FIG. 9 illustrates an example of data of OCV to SOC obtained from the travel data of one electric vehicle actually plotted on a graph.
Figure 10:
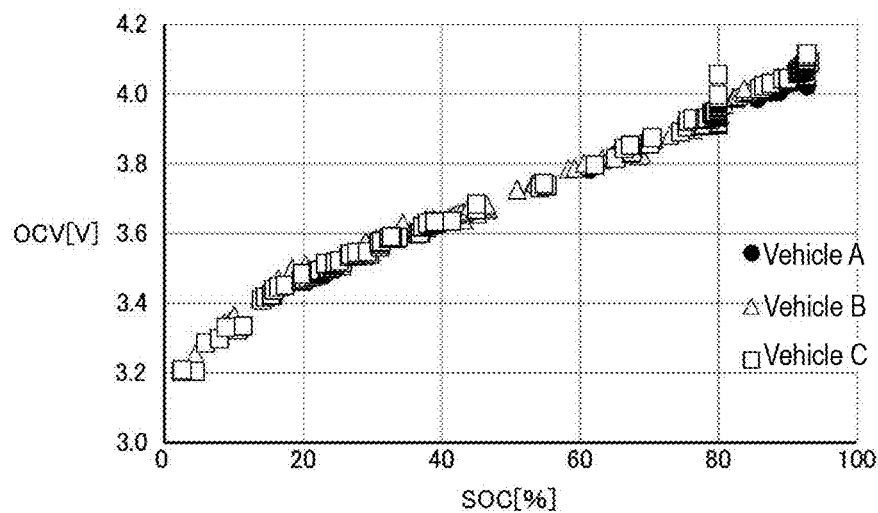
FIG. 10 illustrates an example of data of OCV to SOC obtained from the travel data of three electric vehicles actually plotted on a graph.
Figure 11:
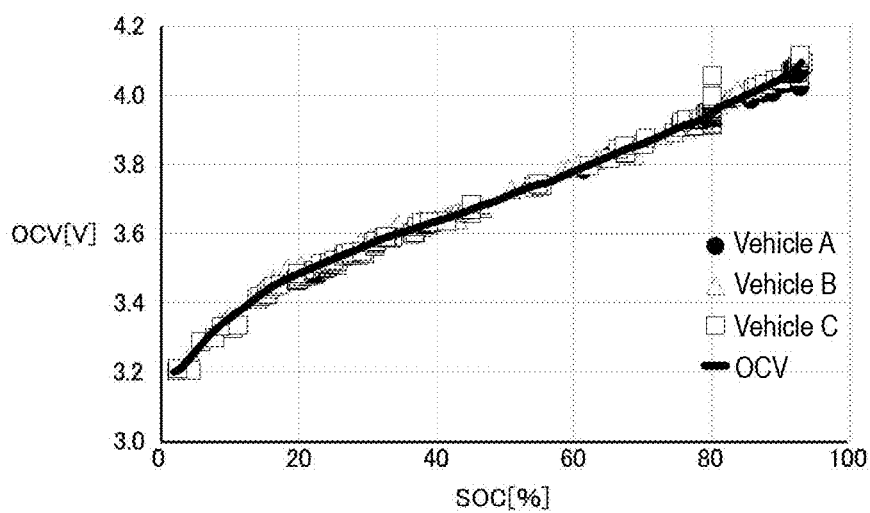
FIG. 11 illustrates an example of the SOC-OCV characteristic actually estimated from the travel data of three electric vehicles.

FIG. 8 is a diagram showing an example in which the SOC-OCV characteristic is actually estimated from the travel data of one electric vehicle 3. FIG. 9 is a diagram showing an example in which data of OCV to SOC obtained from the travel data of one electric vehicle 3 is actually plotted on a graph. FIG. 10 is a diagram showing an example in which data of OCV to SOC obtained from the travel data of three electric vehicles 3 is actually plotted on a graph. FIG. 11 is a diagram showing an example in which the SOC-OCV characteristic is actually estimated from the travel data of three electric vehicles 3.

Even when the number of points of travel data of one electric vehicle 3 (vehicle A) is small as shown in FIG. 9, plotting the travel data of three electric vehicles 3 (vehicle A, B, and C) as shown in FIG. 10 increases the number of points of sample data. As shown in FIG. 11, the SOC-OCV characteristic generated based on the travel data of three electric vehicles 3 becomes a smoother curve than the SOC-OCV characteristic generated based on the travel data of one electric vehicle 3 shown in FIG. 8. The SOC-OCV characteristic generated based on the travel data of three electric vehicles 3 shown in FIG. 11 is within an error of 3% as compared with the SOC-OCV characteristic derived by the test.

In the SOC-OCV characteristic, when a plurality of pieces of different sample data (OCV data to SOC) are acquired, a degree of adopting the acquired sample data may be determined in consideration of an allowable range of the error of the SOC estimation value. For the degree of adopting the sample data, for example, an average and a standard deviation ($\sigma$) of the OCV are calculated for each SOC, and the weighting of the sample data is determined to be lowered depending on whether the OCV is away from the average by more than or equal to $2\sigma$. In addition, for example, there is a case where there are 10 points of the acquired sample data for ten electric vehicles 3 at SOC=50%, and there are two points thereof for the two electric vehicles 3 at SOC=10%. In consideration of such a case, in another example, in the case of the sample data being smaller than the other SOCs from the average by more than or equal to $2\sigma$, the weighting of the degree of adopting the sample data may be determined to be lowered.

The sample data plotted in the SOC-OCV characteristic is obtained, for example, by taking an average value (or median value) for each SOC (or OCV) and performing Kernel regression or linear interpolation thereon, or fitting the average value to a preset function. In this way, by weighting or selecting the sample data plotted on the SOC-OCV characteristic, the SOC-OCV characteristic with high accuracy can be obtained.

Incidentally, there is a case where the SOC of the operation data of the plurality of cells E1 to En transmitted from electric vehicles 3 cannot be used, which includes the case where it is determined that the standard deviation ($\sigma$) with respect to the SOC is larger than a preset threshold and is not suitable for use as sample data to be plotted in the SOC-OCV characteristic, and the case where management unit 42 of electric vehicle 3 does not have a function of estimating the SOC. In such cases, the SOC is estimated by calculation system 1 or business operator system 2 based on the full charge capacity FCC and the charge and discharge capacity Q, and the sample data used for the SOC-OCV characteristic may be extracted accordingly. The full charge capacity FCC and the charge and discharge capacity Q are calculated based on the OCV and the current integrated value generated based on the voltage and the current measured by management unit 42.

Figure 12:
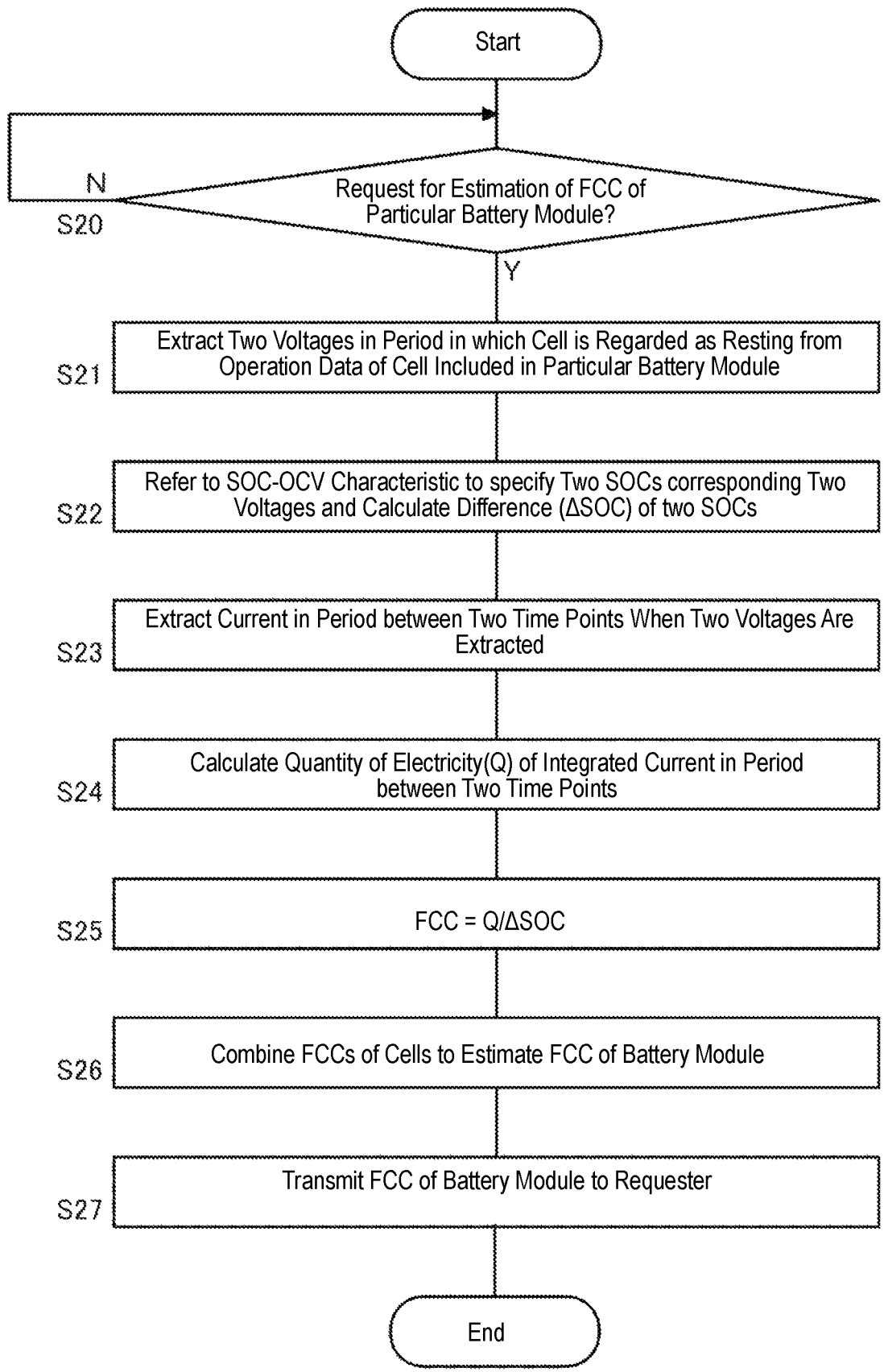
FIG. 12 is a flowchart illustrates a flow of FCC estimation processing of a battery module by the calculation system.

FIG. 12 is a flowchart showing a flow of FCC estimation processing of battery module 41 by calculation system 1. Upon receiving the request for the FCC estimation processing for particular battery module 41 from business operator system 2 ("Y" in S20), extraction unit 112 extracts two voltages during the period in which the cell is regarded as resting based on the operation data of the cell included in particular battery module 41 (S21).

At that time, extraction unit 112 needs to extract the two voltages from two independent periods in which the cell is regarded as resting, with a charge and discharge period interposed therebetween. For example, extraction unit 112 may extract voltages from a period in which the cell can be considered to be resting before electric vehicle 3 starts traveling and a period in which the cell is regarded as resting after electric vehicle 3 finishes traveling. Further, extraction unit 112 extracts two voltages from the travel data of most recent possible date (for example, the latest travel date).

Estimation unit 113 refers to the SOC-OCV characteristic of the same type as the cell held in SOC-OCV characteristic holding unit 122 to specify two SOCs corresponding to the two extracted voltages, respectively. Estimation unit 113 calculates a difference $\Delta$SOC between the two specified SOCs (S22).

When the SOC-OCV characteristic of the same type as the cell is mapped for at least one of the temperature category and the degree of degradation category, the SOC-OCV characteristic according to the temperature condition and the degree of degradation condition of the cell is used. As the temperature condition of the cell, for example, a temperature obtained by averaging temperatures in a period between two time points when two OCVs are acquired can be used. As the degree of degradation condition of the cell, a degree of degradation estimated based on the period of using the cell and the cumulative value of the charge and discharge current can be used.

Extraction unit 112 extracts the current in the period between the time points when the two voltages are extracted, from the operation data of the cell (S23). Estimation unit 113 calculates the current integrated quantity Q in the period between the time points when the two voltages are extracted (S24). Estimation unit 113 estimates the FCC (see above (Equation 1)) by dividing the current integrated amount Q by the difference ΔSOC (S25).

Estimation unit 113 combines the FCCs of all the cells included in particular battery module 41 according to the connection form of all the cells, and estimates the FCC of battery module 41 (S26). Estimation unit 113 transmits the estimated FCC of battery module 41 to business operator system 2 as a request source (S26).

Business operator system 2 that is the request source can estimate the SOH of battery module 41 (see above (Equation 2)) based on the received FCC of battery module 41 and the initial FCC of battery module 41. Note that the SOH of battery module 41 may also be estimated on the side of calculation system 1.

As described above, according to the present exemplary embodiment, the SOC-OCV characteristic of the cell in which the SOC-OCV characteristic has not been acquired can be easily acquired at low cost. The present exemplary embodiment does not require the acquisition of the basic data for creating the SOC-OCV characteristic, and enables the reduction of cost in terms of time and money for acquiring the basic data. If the SOC-OCV characteristic can be acquired, the FCC and the SOH of battery module 41 can be estimated with high accuracy. As described above, the FCC and the SOH of a wide variety of batteries manufactured by various battery manufacturers can be estimated with high accuracy without acquiring the basic data. As a result, the business operator can determine an appropriate vehicle disposal timing of electric vehicle 3. In addition, the business operator can estimate the reusable value of battery module 41 with high accuracy.

Further, by merging and using the travel data of the plurality of electric vehicles 3 of the same type, the estimation accuracy of the SOC-OCV characteristic can be improved. For example, even when one electric vehicle 3 does not use the entire SOC range, the SOC-OCV characteristic can be generated with high accuracy. In addition, even when the travel data of one electric vehicle 3 contains large noise, the SOC-OCV characteristic can be generated with high accuracy.

Moreover, the SOC-OCV characteristic corresponding to secular change can be generated by selecting the data period used as the sample data. It is also possible to correspond to complex aging depending on the method of use of electric vehicle 3. The present exemplary embodiment does not require measurement of the deterioration characteristic of the cell in advance, nor does an acceleration test based on a plurality of conventional patterns is required.

The present disclosure has been described above in accordance with the exemplary embodiment. It will be understood by the person of ordinary skill in the art that the exemplary embodiment is merely an example, other modified examples in which configuration elements and processing processes of the exemplary embodiment are variously combined are possible, and the other modified examples still fall within the scope of the present disclosure.

In the above exemplary embodiment, an example has been described in which the FCC of battery module 41 is fed back from calculation system 1 to business operator system 2. In this regard, the SOC-OCV characteristic according to the degree of degradation category of the particular cell may be fed back to business operator system 2. In particular, in battery system 40 in which management unit 42 having no mechanism for updating the held SOC-OCV characteristic according to the period of using the cell is used, the SOC estimation accuracy is improved by updating the SOC-OCV characteristic according to the degree of degradation category acquired from calculation system 1 according to the period of using the cell.

In the above exemplary embodiment, the example in which the characteristic of the battery cell included in battery system 40 are estimated by calculation system 1 has been described. In this regard, the characteristic of the capacitor cell (for example, an electric double layer capacitor cell or a lithium ion capacitor cell) included in the capacitor system may be estimated by calculation system 1.

In the above exemplary embodiment, the example in which the characteristic of the cell of battery system 40 mounted on electric vehicle 3 is estimated by calculation system 1 has been described. In this regard, the characteristic of the cell of the battery system or the capacitor system mounted on the stationary power storage system may be estimated by calculation system 1.

The exemplary embodiment may be specified by the following items.

[Item 1]

A calculation system (1) includes:
- a data acquisition unit (111) configured to acquire operation data of a battery (E1, 41), the operation data including at least voltages and currents measured by a management device (42) at a plurality of time points, and states of charge (SOCs) estimated based on at least one of the voltages and the currents, the management device (42) being configured to manage the battery (E1, 41);
- an extraction unit (112) configured to, extract, as sample data, a set of an SOC and a voltage from sets of the SOCs and the voltages the plurality of time points included in the operation data in a period in which the battery (E1, 41) is regarded as resting, the period being specified based on the currents; and
- an estimation unit (113) configured to estimate an SOC-open circuit voltage (OCV) characteristic of the battery (E1, 41) based on the extracted sample data.

According to this, the SOC-OCV characteristic of battery (E1, 41) can be produced at low cost.

[Item 2]

In the calculation system (1) according to item 1,
- the data acquisition unit (111) is configured to acquire operation data of a plurality of types of batteries (E1, 41) including the battery (E1, 41) measured by a plurality of management devices (42) including the management device (42), and
- the estimation unit (113) is configured to estimate an SOC-OCV characteristic for each of the types of batteries (E1, 41).

According to this, the SOC-OCV characteristic of battery (E1, 41) can be produced at low cost and with high accuracy.

[Item 3]

In the calculation system (1) according to item 2, the data acquisition unit (111) is configured to acquire the operation data of the plurality of types of batteries (E1, 41) via a network.

According to this, the operation data of the plurality of types of types of batteries (E1, 41) can be easily and efficiently increased.

[Item 4]

In the calculation system (1) according to item 1 or 2, wherein the extraction unit (112) is configured to extract a set of the SOC and the voltage in a period that a current less than or equal to a predetermined value continues for a duration more than or equal to a predetermined duration.

According to this, the number of pieces of sample data to be extracted can be increased.

[Item 5]

In the calculation system (1) according to item 1 or 2, the extraction unit (112) is configured to:
correct the measured voltages based on a convergence characteristic of a polarization voltage of the battery (E1, 41) during a period until the measured voltage converges to an OCV after a charging or discharging of the battery (E1, 41) ends; and
extract the corrected voltages.

According to this, the number of pieces of sample data to be extracted can be increased.

[Item 6]

In the calculation system (1) according to any one of items 1 to 5,
the extraction unit (112) configured to separately extract a set of the SOCs and the voltages in a period that the battery (E1, 41) is regarded as resting after a charging of the battery (E1, 41) is ends and a set of the SOCs and the voltages in a period that the battery (E1, 41) is regarded as resting after a discharging of the battery (E1, 41) ends, and
the estimation unit (113) is configured to separately generates the SOC-OCV characteristic for the charging of the battery (E1, 41) and the SOC-OCV characteristic for the discharging of the battery (E1, 41).

According to this, the SOC-OCV characteristics for charging and discharging battery (E1, 41) can be generated, and the estimation accuracy of the FCC can be improved.

[Item 7]

In the calculation system (1) according to any one of items 1 to 6, when full charge capacity (FCC) estimation for a particular battery (E1, 41) is requested,
the extraction unit (112) is configured to:
extract voltages from the operation data of the particular battery (E1, 41) from two periods sandwiching a charge and discharge period between the two periods, the particular battery (E1, 41) being regarded as resting in the two periods; and
extract a current in a period between two time points when the two voltages are extracted, and
the estimation unit (113) is configured to:
refer to the SOC-OCV characteristic to specify two SOCs respectively corresponding to the two voltages to calculate a difference between the two SOCs, and integrate the current in the period between the two time points to calculate a current integrated amount; and
estimate the FCC of the particular battery (E1, 41) based on the difference between the SOCs and the integrated current.

According to this, the FCC of battery (E1, 41) can be acquired with high accuracy without generating the SOC-OCV characteristic by oneself

[Item 8]

A battery characteristic estimation method includes:
acquiring operation data of a battery (E1, 41), the operation data including at least voltages and currents measured by a management device (42) at a plurality of time points, and states of charge (SOCs) estimated based on at least one of the voltages and the currents, the management device (42) being configured to manage the battery (E1, 41);
extracting, as sample data, a set of an SOC and a voltage from sets of the SOCs and the voltages the plurality of time points included in the operation data in a period in which the battery (E1, 41) is regarded as resting, the period being specified based on the currents; and
estimating an SOC-open circuit voltage (OCV) characteristic of the battery (E1, 41) based on the extracted sample data.

According to this, the SOC-OCV characteristic of battery (E1, 41) can be produced at low cost.

[Item 9]

A battery characteristic estimation program that causes a computer to execute a method including:
acquiring operation data of a battery (E1, 41), the operation data including at least voltages and currents measured by a management device (42) at a plurality of time points, and states of charge (SOCs) estimated based on at least one of the voltages and the currents, the management device (42) being configured to manage the battery (E1, 41);
extracting, as sample data, a set of an SOC and a voltage from sets of the SOCs and the voltages the plurality of time points included in the operation data in a period in which the battery (E1, 41) is regarded as resting, the period being specified based on the currents; and
estimating an SOC-open circuit voltage (OCV) characteristic of the battery (E1, 41) based on the extracted sample data.

According to this, the SOC-OCV characteristic of battery (E1, 41) can be produced at low cost.

REFERENCE MARKS IN THE DRAWINGS

1: calculation system
2: business operator system
E1-En: cell
T1, T2: temperature sensor
RY1, RY2: relay
3: electric vehicle
4: charger
5: network
11: processor
111: data acquisition unit
112: extraction unit
113: estimation unit
12: storage
121: travel data holding unit
122: SOC-OCV characteristic holding unit
21: processor
22: storage
221: travel data holding unit
222: driver data holding unit
23: display unit
24: operation unit
30: vehicle controller
34: motor
35: inverter
36: wireless communication unit
36a: antenna
38: charging cable
40: battery system
41: battery module
42: management unit
43: voltage measurement unit
44: temperature measurement unit
45: current measurement unit
46: battery controller
46a: SOC-OCV map

The invention claimed is:

1. A calculation system comprising:
a data acquisition unit configured to acquire operation data of a battery while the battery is mounted on a battery system, the operation data including at least voltages and currents measured by a management device at a plurality of time points, and states of charge (SOCs) estimated based on at least one of the voltages and the currents, the management device being configured to manage the battery;
an extraction unit configured to, extract, as sample data, a set of an SOC and a voltage from sets of the SOCs and the voltages the plurality of time points included in the operation data in a period in which the battery is regarded as resting, the period being specified based on the currents; and
an estimation unit configured to estimate an SOC-open circuit voltage (OCV) characteristic of the battery by generating an approximate curve based on the extracted sample data in a state where an actual SOC-OCV characteristics of the battery managed by the management device have not been acquired.

2. The calculation system according to claim 1, wherein
the data acquisition unit is configured to acquire operation data of a plurality of types of batteries including the battery measured by a plurality of management devices including the management device, and
the estimation unit is configured to estimate an SOC-OCV characteristic for each of the types of batteries.

3. The calculation system according to claim 2, wherein the data acquisition unit is configured to acquire the operation data of the plurality of types of batteries via a network.

4. The calculation system according to claim 1, wherein the extraction unit is configured to extract a set of the SOC and the voltage in a period that a current less than or equal to a predetermined value continues for a duration more than or equal to a predetermined duration.

5. The calculation system according to claim 1, wherein the extraction unit is configured to:
correct the measured voltages based on a convergence characteristic of a polarization voltage of the battery during a period until the measured voltage converges to an OCV after a charging or discharging of the battery ends; and
extract the corrected voltages.

6. The calculation system according to claim 1, wherein
the extraction unit configured to separately extract a set of the SOCs and the voltages in a period that the battery is regarded as resting after a charging of the battery is ends and a set of the SOCs and the voltages in a period that the battery is regarded as resting after a discharging of the battery ends, and
the estimation unit is configured to separately generate the SOC-OCV characteristic for the charging of the battery and the SOC-OCV characteristic for the discharging of the battery.

7. The calculation system according to claim 1, wherein, when full charge capacity (FCC) estimation for a particular battery is requested,
the extraction unit is configured to:
extract voltages from the operation data of the particular battery from two periods sandwiching a charge and discharge period between the two periods, the particular battery being regarded as resting in the two periods; and
extract a current in a period between two time points when the two voltages are extracted, and
the estimation unit is configured to:
refer to the SOC-OCV characteristic to specify two SOCs respectively corresponding to the two voltages to calculate a difference between the two SOCs, and integrate the current in the period between the two time points to calculate a current integrated amount; and
estimate the FCC of the particular battery based on the difference between the SOCs and the integrated current.

8. The calculation system according to claim 1, wherein
the data acquisition unit is configured to acquire operation data of a plurality of batteries including the battery measured by a plurality of management devices including the management device,
the extraction unit is configured to extract the sample data from the plurality of batteries, respectively, and
the estimation unit is configured to generate the approximate curve based on the extracted sample data from the plurality of batteries.

9. The calculation system according to claim 1, wherein
the estimation unit estimates the SOC-OCV characteristics of the battery by generating the approximate curve based on operation data obtained by merging operation data of the battery acquired from a plurality of different battery systems of a same type.

10. A battery characteristic estimation method comprising:
acquiring operation data of a battery while the battery is mounted on a battery system, the operation data including at least voltages and currents measured by a management device at a plurality of time points, and states of charge (SOCs) estimated based on at least one of the voltages and the currents, the management device being configured to manage the battery;
extracting, as sample data, a set of an SOC and a voltage from sets of the SOCs and the voltages the plurality of time points included in the operation data in a period in which the battery is regarded as resting, the period being specified based on the currents; and
estimating an SOC-open circuit voltage (OCV) characteristic of the battery by generating an approximate curve based on the extracted sample data in a state where an actual SOC-OCV characteristics of the battery managed by the management device have not been acquired.

11. The battery characteristic estimation method according to claim 10, wherein
the SOC-OCV characteristics of the battery is estimated by generating the approximate curve based on operation data obtained by merging operation data of the battery acquired from a plurality of different battery systems of a same type.

12. A non-transitory computer-readable recording medium storing a battery characteristic estimation program that causes a computer to execute a method comprising:
acquiring operation data of a battery while the battery is mounted on a battery system, the operation data including at least voltages and currents measured by a management device at a plurality of time points, and states of charge (SOCs) estimated based on at least one of the voltages and the currents, the management device being configured to manage the battery;
extracting, as sample data, a set of an SOC and a voltage from sets of the SOCs and the voltages the plurality of time points included in the operation data in a period in which the battery is regarded as resting, the period being specified based on the currents; and estimating an SOC-open circuit voltage (OCV) characteristic of the battery by generating an approximate curve based on the extracted sample data in a state where an actual SOC-OCV characteristics of the battery managed by the management device have not been acquired.

13. The non-transitory computer-readable recording medium according to claim 12, wherein the SOC-OCV characteristics of the battery is estimated by generating the approximate curve based on operation data obtained by merging operation data of the battery acquired from a plurality of different battery systems of a same type.

* * * * *